United States Patent
Stirton et al.

(10) Patent No.: US 7,869,894 B2
(45) Date of Patent: Jan. 11, 2011

(54) METHOD AND SYSTEM FOR ADVANCED PROCESS CONTROL USING A COMBINATION OF WEIGHTED RELATIVE BIAS VALUES

(75) Inventors: James Broc Stirton, Dresden (DE); Andre Holfeld, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 800 days.

(21) Appl. No.: 11/420,625

(22) Filed: May 26, 2006

(65) Prior Publication Data

US 2007/0078556 A1 Apr. 5, 2007

(30) Foreign Application Priority Data

Sep. 30, 2005 (DE) .................. 10 2005 046 972

(51) Int. Cl.
*G06F 19/00* (2006.01)
(52) U.S. Cl. ............ 700/109; 700/108; 700/121; 702/84
(58) Field of Classification Search ............ 700/95, 700/108–110, 121; 702/81, 83–85, 182–184; 438/5, 14
See application file for complete search history.

(56) References Cited

U.S. PATENT DOCUMENTS

| | | | | |
|---|---|---|---|---|
| 6,161,054 | A * | 12/2000 | Rosenthal et al. | 700/121 |
| 6,248,602 | B1 * | 6/2001 | Bode et al. | 438/14 |
| 6,333,786 | B1 * | 12/2001 | Uzawa et al. | 700/121 |
| 6,346,426 | B1 | 2/2002 | Toprac et al. | 438/8 |
| 6,615,101 | B1 * | 9/2003 | Nicholson et al. | 700/108 |
| 6,640,151 | B1 * | 10/2003 | Somekh et al. | 700/121 |
| 6,654,698 | B2 * | 11/2003 | Nulman | 702/85 |
| 6,675,135 | B1 * | 1/2004 | Murray et al. | 700/109 |
| 6,738,682 | B1 | 5/2004 | Pasadyn | 700/100 |
| 6,757,579 | B1 | 6/2004 | Pasadyn | 700/108 |
| 6,836,691 | B1 | 12/2004 | Stirton | 700/108 |
| 6,898,471 | B1 | 5/2005 | Sun et al. | 700/90 |
| 6,928,628 | B2 * | 8/2005 | Seligson et al. | 438/14 |
| 6,988,017 | B2 | 1/2006 | Pasadyn et al. | 700/121 |
| 7,127,304 | B1 * | 10/2006 | Gould et al. | 700/121 |
| 7,127,316 | B2 * | 10/2006 | Hsu et al. | 700/109 |
| 7,180,443 | B1 | 2/2007 | Mookerjee et al. | 342/195 |

(Continued)

FOREIGN PATENT DOCUMENTS

DE 199 02 795 A1 8/2000

(Continued)

OTHER PUBLICATIONS

Office Action dated Aug. 22, 2008 from related U.S. Appl. No. 11/539,803.

(Continued)

*Primary Examiner*—Charles R Kasenge
(74) *Attorney, Agent, or Firm*—Williams, Morgan & Amerson, P.C.

(57) ABSTRACT

By directly using relative biases, contained in the relative bias date matrix, and by appropriately weighting the components thereof, sampling rate limitations in an APC control scheme may be efficiently compensated for. In particular embodiments, an age-based weighting factor is established that scales measurement data uncertainty according to the delay with which the corresponding measurement data for a specific control thread are obtained.

21 Claims, 2 Drawing Sheets

U.S. PATENT DOCUMENTS

| | | | |
|---|---|---|---|
| 7,181,354 B1 | 2/2007 | Bone et al ..................... | 702/84 |
| 7,289,864 B2 | 10/2007 | Horak et al. ................. | 700/121 |
| 7,349,753 B2 | 3/2008 | Paik ........................... | 700/110 |
| 7,689,028 B2 * | 3/2010 | Sakano et al. ............... | 700/108 |
| 7,738,986 B2 | 6/2010 | Stirton et al. ............... | 700/109 |
| 2005/0071039 A1 | 3/2005 | Mitrovic ..................... | 700/121 |
| 2006/0015206 A1 | 1/2006 | Funk et al. .................. | 700/121 |
| 2006/0129257 A1 | 6/2006 | Chen et al. ................... | 700/96 |
| 2006/0184264 A1 | 8/2006 | Willis et al. ................. | 700/108 |
| 2007/0005172 A1 | 1/2007 | Malig et al. ................. | 700/108 |
| 2007/0238201 A1 | 10/2007 | Funk et al. ................... | 438/14 |

FOREIGN PATENT DOCUMENTS

| | | |
|---|---|---|
| DE | 102 19 363 A1 | 11/2003 |
| DE | 698 11 742 T2 | 12/2003 |
| EP | 1 420 314 A2 | 11/2003 |
| WO | WO 03/023538 A2 | 3/2003 |

OTHER PUBLICATIONS

Letter dated Jan. 25, 2010 from Grunecker Kinkeldey Stockmair & Schwanhäusser.

Edgar et al., "Model-Based Control in Microelectronic Manufacturing," Dec. 1999, IEEE, pp. 4185-4191.

Qin et al., "Semiconductor Manufacturing Process Control and Monitoring: A Fab-Wide Framework," Jun. 2, 2005, Elseviee, pp. 179-191.

Smith et al., "Run by Run Advanced Process Control of Metal Sputter Deposition," May 1998, IEEE, vol. 11, No. 2, pp. 276-284.

Ciccarella et al., "Multiple Processor Architectures for Real Time Parameter Estimation," 1989, IEEE, pp. 93-100.

van der Veen, "Error analysis in the evaluation of measurement uncertainty," Apr. 1, 2003, IOPscience, pp. 42-50.

Final Office Action from related U.S. Appl. No. 11/382,112 dated Mar. 30, 2010.

* cited by examiner

METHOD AND SYSTEM FOR ADVANCED PROCESS CONTROL USING A COMBINATION OF WEIGHTED RELATIVE BIAS VALUES

BACKGROUND OF THE INVENTION

1. Field of the Invention

The present invention relates to the field of fabricating semiconductor devices, and, in particular, to advanced process control (APC) techniques for manufacturing processes, wherein an improved process control quality is achieved by adjusting process parameters in a predictive manner on the basis of a process model and measurement data.

2. Description of the Related Art

Today's global market forces manufacturers of mass products to offer high quality products at a low price. It is thus important to improve yield and process efficiency to minimize production costs. This is especially true in the field of semiconductor fabrication where it is essential to combine cutting edge technology with mass production techniques. It is, therefore, the goal of semiconductor manufacturers to reduce the consumption of raw materials and consumables while at the same time improve product quality and process tool utilization. The latter aspect is especially important since the equipment used in modern semiconductor facilities is extremely cost intensive and represents the dominant part of the total production costs. For example, in manufacturing modern integrated circuits, 500 or more individual processes may be necessary to complete the integrated circuit, wherein failure in a single process step may result in a loss of the complete integrated circuit. This problem is even exacerbated when the size of substrates, on which a plurality of such integrated circuits are processed, steadily increases, so that failure in a single process step may entail the loss of a large number of products.

Therefore, the various manufacturing stages have to be thoroughly monitored to avoid undue waste of manpower, tool operation time and raw materials. Ideally, the effect of each individual process step on each substrate would be detected by measurement and the substrate under consideration would be released for further processing only if the required specifications were met. However, such a process control strategy is not practical since measuring the effects of certain processes may require relatively long measurement times, frequently ex situ, or may even necessitate the destruction of the sample. Moreover, immense effort, in terms of time and equipment, would have to be made on the metrology side to provide the required measurement results. Additionally, utilization of the process tool would be minimized since the tool would be released only after the provision of the measurement result and its assessment.

The introduction of statistical methods, also referred to as statistical process control (SPC), for adjusting process parameters significantly relaxes the above problem and allows a moderately high utilization of the process tools while attaining a relatively high product yield. Statistical process control is based on the monitoring of the process output to thereby identify an out-of-control situation, wherein a causal relationship is established to an external disturbance. After occurrence of an out-of-control situation, operator interaction is usually required to manipulate a process parameter so as to return to an in-control situation, wherein the causal relationship may be helpful in selecting an appropriate control action. Nevertheless, in total, a large number of dummy substrates or pilot substrates may be necessary to adjust process parameters of respective process tools, wherein parameter drifts during the process have to be taken into consideration when designing a process sequence, since such parameter drifts may remain undetected over a long time period or may not be efficiently compensated for by SPC techniques.

Recently, a process control strategy has been introduced and is continuously improving, allowing a high degree of process control, desirably on a run-to-run basis, with a moderate amount of measurement data. In this control strategy, so-called advanced process control (APC), a model of a process or of a group of interrelated processes is established and implemented in an appropriately configured process controller. The process controller also receives information which may include pre-process measurement data and/or post-process measurement data, as well as information related, for instance, to the substrate history, such as type of process or processes, the product type, the process tool or process tools in which the products are to be processed or have been processed in previous steps, the process recipe to be used, i.e., a set of required steps for the process or processes under consideration, wherein possibly fixed process parameters and variable process parameters may be contained, and the like. From this information and the process model, the process controller determines a controller state or process state that describes the effect of the process or processes under consideration on the specific product, thereby permitting the establishment of an appropriate parameter setting of the variable parameters of the specified process recipe to be performed with the substrate under consideration, wherein tool-specific internal or "low-rank" control units (substantially) maintain the parameter values, such as flow rates, temperatures, exposure doses and the like, at the targets specified by the APC controller.

Thus, the APC controller may have a predictive behavior, whose accuracy may depend on the amount of measurement data and its timeliness with respect to the current process run. The measurement data, however, may stem from different process tools performing equivalent processes, and/or only dedicated wafers or wafer sites may be subjected to measurement, thereby creating a certain amount of uncertainty, which may render the measurement data and any predicted process states derived therefrom less reliable. Thus, it is important to monitor and track tool-specific systematic deviations with respect to a target output, which is also referred to as bias of the respective tool, in order to appropriately estimate the process state for the respective process tools. However, the limited sampling rate, i.e., the restricted number of substrates or substrate sites per substrate that are actually subjected to measurement, may prevent obtaining an updated measurement value for determining the respective presently valid tool bias for each of the process tools involved in the processing of the plurality of substrates under consideration.

Due to these limitations with respect to substrate sampling, it is convenient to track systematic biases within a group or lot of substrates processed by a plurality of process tools on the basis of equivalent process recipes, in the form of relative values, which indicate a difference of the respective individual biases. For example, if four different tools perform an equivalent process recipe on the lot of substrates, six different relative biases may be defined for tracking the process state. These relative biases may then be used in the determination of process state estimates used for controlling one or more process tools. Since the available relative biases of the respective process tools may not be updated for each metrology event, due to the limitations with respect to sampling rate, the process state prediction may therefore occur on the basis of aged, and hence less reliable, measurement data, thereby reducing control efficiency.

In view of the situation described above, there exists a need for a technique that enables an enhanced control strategy, wherein one or more of the problems identified above may be avoided or the effects thereof at least significantly be reduced.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that may provide enhanced control efficiency in situations when a manufacturing process that is to be controlled on the basis of an APC strategy includes a plurality of equivalent process tools or process chambers, and process state estimations are monitored on the basis of a state estimation matrix, the components of which represent relative biases. Hereby, the biases are determined on the basis of a sampling rate, which may not provide updated measurement data for each of the relative biases in every metrology event. For enhancing control accuracy in this situation, the present invention contemplates the selection of a well-suited available bias estimation during run time of the APC controller by appropriately manipulating the relative biases in the state estimation matrix, thereby taking into consideration an age of measurement data and/or the uncertainty thereof.

According to one illustrative embodiment of the present invention, a method comprises performing a specified manufacturing process on a group of substrates in a plurality of equivalent process tools and obtaining measurement data from some of the group of substrates processed by the plurality of process tools. Moreover, the method comprises determining updated values of relative biases for each of the plurality of equivalent process tools on the basis of the measurement data and a current value of the relative biases, wherein the relative biases indicate a deviation of a process output of the manufacturing process between two of the plurality of equivalent process tools. In addition, the method comprises weighting the relative biases on the basis of an age of the measurement data and controlling the manufacturing process on the basis of the weighted relative biases.

According to another illustrative embodiment of the present invention, a method comprises controlling a manufacturing process by an APC strategy on the basis of relative biases, wherein each relative bias is associated with a respective one of a plurality of equivalent process tools used in the manufacturing process. The method further comprises determining the relative biases on the basis of a weighting factor indicating an uncertainty of measurement data associated with a respective one of the relative biases.

In accordance with yet another illustrative embodiment of the present invention, an APC control system comprises a model-based control section configured to determine at least one updated manipulated variable for a process tool of a process sequence. For this purpose, the control section is configured to determine the updated manipulated variable on the basis of a model, a measurement data related to a process output associated with the process tool, a relative bias matrix and a weighting factor for operating on the relative bias matrix, wherein the weighting factor indicates at least one of an age of the measurement data and an uncertainty thereof.

BRIEF DESCRIPTION OF THE DRAWINGS

The invention may be understood by reference to the following description taken in conjunction with the accompanying drawings, in which like reference numerals identify like elements, and in which.

Figure 1:
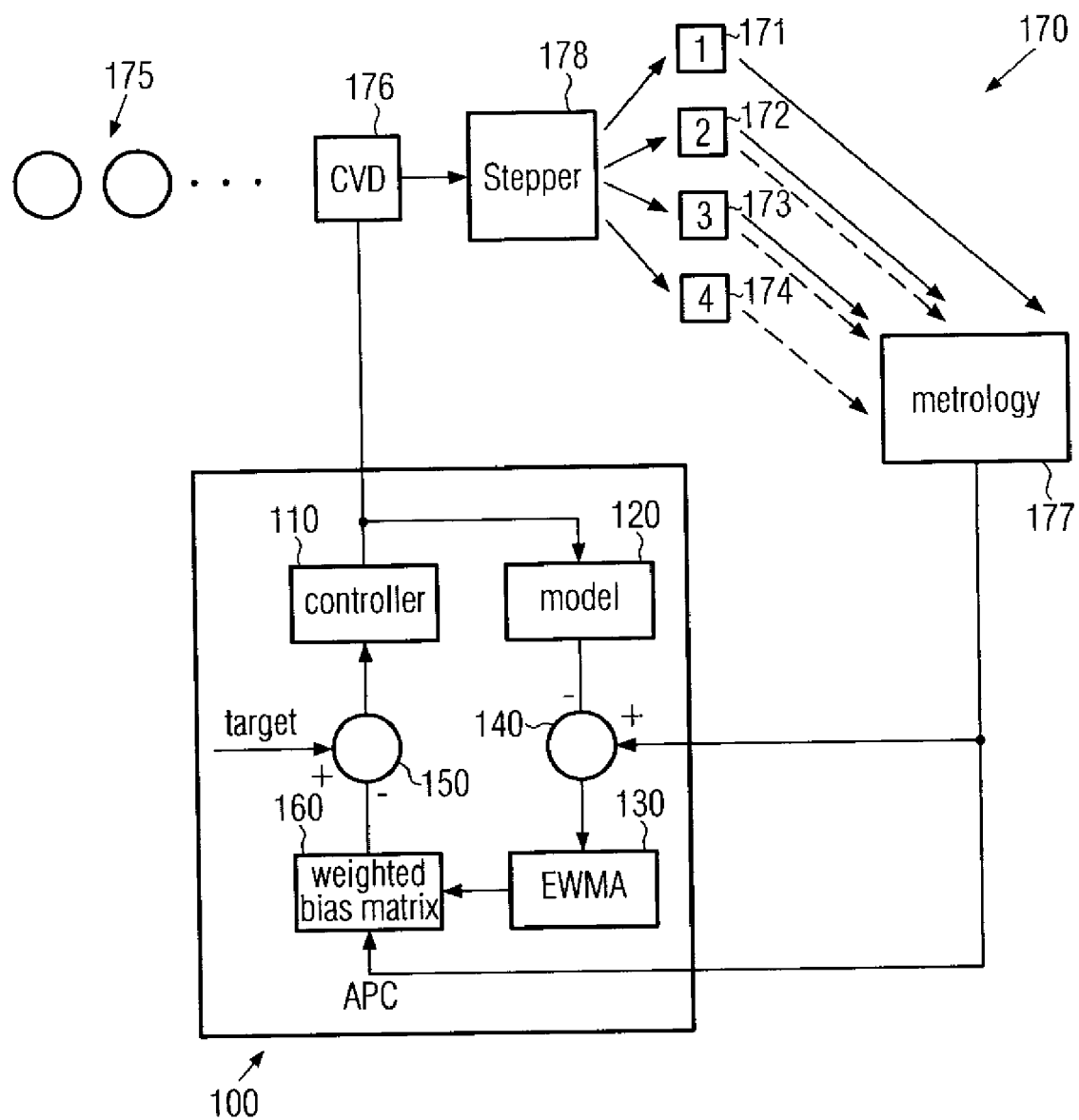
FIG. 1 schematically illustrates a manufacturing environment including an APC controller in accordance with one illustrative embodiment of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is directed to model-based control strategies in which the control state, i.e., the state of the various manipulated variables of one or more process tools to be controlled, is determined on the basis of measurement data that represents the effect of a manufacturing process performed by the one or more process tools to be controlled, wherein the measurement data may be gathered on the basis of a static or dynamic sampling rate. In one illustrative embodiment, the measurement data obtained according to the sampling rate, i.e., the number of measurement results obtained from sampled substrates selected from the entirety of processed substrates, may not be available simultaneously but may have a respective delay depending on the selected sampling rate. For instance, in a lot-based process control, a sampling rate may specify a given number of substrates per lot, and also a given number of measurement sites per substrate, from which measurement results are obtained and used for process control during processing of a subsequent lot of substrates. When the number of sample substrates is less than the number of equivalent process tools used for processing the lot, the process state estimation for the subsequent lot to be processed may be based on measurement data of different age.

Similarly, the measurement data obtained from the sample substrates may have a different amount of uncertainty, due to tool variations, substrate non-uniformities and the like, so that the "reliability" or "confidence" of the respective measurement data may significantly differ for the various tool biases. Consequently, in the former case, a "delta-to-mean bias" for each equivalent process tool may not be calculated for the current control move unless measurement data from multiple substrate lots are combined, which may result, however, in undue noise, especially when a lot-to-lot variation is comparable or greater than the respective tool biases. In the latter case, rather noisy data would be used for the bias update, at least for some of the equivalent process tools, thereby also resulting in a degraded controller performance. As a consequence, the one or more manipulated variables required for controlling the manufacturing process under consideration, which are established on the basis of the current state estimations, may result in an undue deviation from a target value for the respective process output.

In this connection, a manipulated variable or a control variable is to be understood as a process parameter of a process recipe, the value of which may be adjusted to obtain a certain effect on one or more controlled variables, which may represent an output characteristic of the process or process sequence under consideration, wherein the output characteristic may be determined on the basis of measurements. As explained above, during production conditions in a semiconductor facility, measurements may be obtained from a limited number of substrates or substrate sites only, due to throughput and cost considerations, thereby imparting an increased uncertainty to these measurement results due to a plurality of fluctuations and non-uniformities. For example, a first contribution to the measurement uncertainty may be caused by the measurement process itself, as, for instance, metrology tool induced variations, environmental influences, sample preparation and the like may significantly affect the measurement process. On the other hand, the specific selection of the measurement samples and particularly the number thereof may also have a significant influence on the uncertainty of the measurement data, wherein, in particular, the various amounts of delay of the measurement data may also contribute to a reduced stability of the overall control process.

Contrary to conventional approaches, the present invention provides a technique that explicitly takes into consideration the uncertainty and/or age or delay of the measurement data in calculating an updated process state for one or more process tools to be controlled for a subsequent run of a specified manufacturing process. For this purpose, the relative biases for a plurality of equivalent process tools used in the specified manufacturing process are determined by explicitly taking into consideration a measure of the uncertainty and/or a measure for the delay or age of measurement data.

Figure 2A:
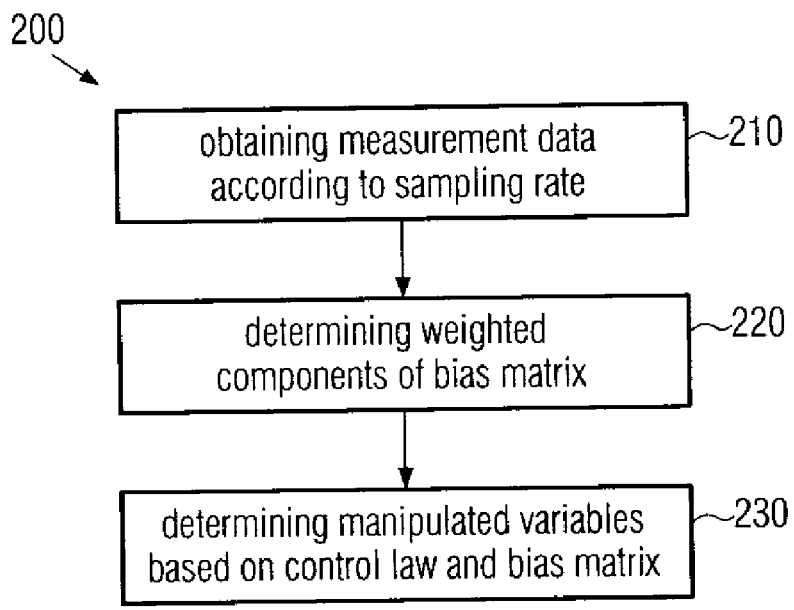
FIGS. 2a and 2b represent flowcharts illustrating a method for manipulating a relative bias matrix on the basis of an age of measurement data and/or an uncertainty thereof (FIG. 2a) and a more detailed process flow for determining weighted components of the bias matrix (FIG. 2b).
Figure 2B:
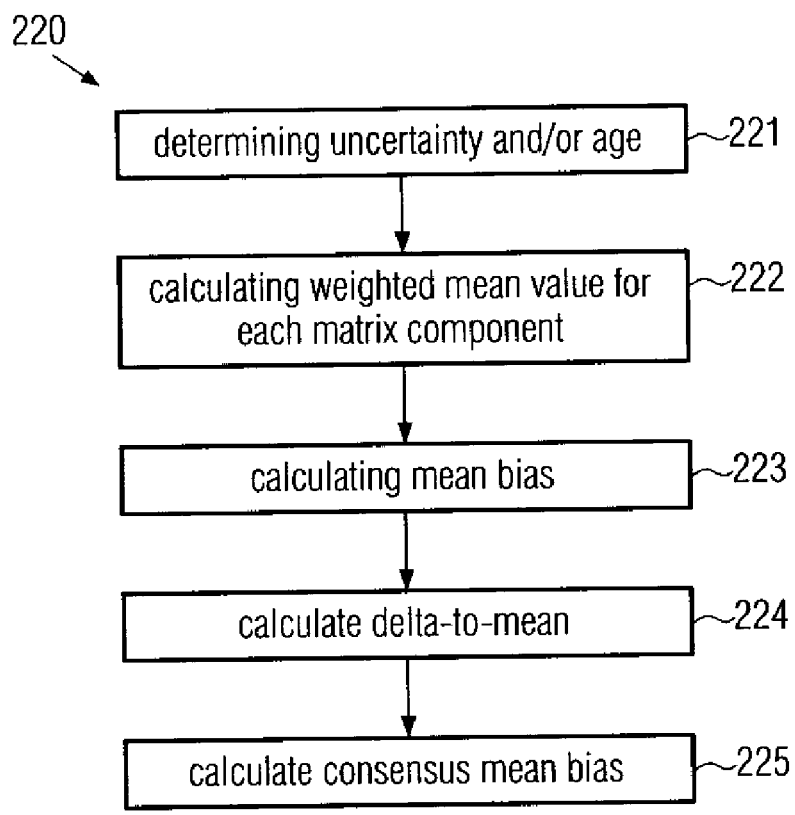

With reference to FIGS. 1 and 2a-2b, further illustrative embodiments of the present invention will now be described in more detail. FIG. 1 schematically shows a control system 100, which is associated with a manufacturing environment 170, for controlling one or more process tools contained therein. The manufacturing environment 170 may comprise a plurality of process tools 176, 178, 171, 172, 173, 174, which may be considered as a functional unit for performing a specified sequence of process steps on a plurality of substrates 175 so as to produce a certain process output. For example, the plurality of process tools 176, 178, 171, 172, 173, 174 may comprise deposition tools, implantation tools, etch tools, CMP tools, photolithography tools, or any combination thereof, through which the plurality of substrates 175 is processed in a specified sequence.

In the illustrative embodiment shown in FIG. 1, the manufacturing environment 170 may comprise the plurality of process tools 176, 178, 171, 172, 173, 174 as a functional block including, for instance, one or more chemical vapor deposition (CVD) tools, such as the tool 176, which may, for instance, be configured to provide a specified material layer on the plurality of substrates 175. For example, the CVD tool 176 may be configured to deposit an anti-reflective coating (ARC) layer to be formed in accordance with a specified process recipe so as to endow the specific material layer with optical characteristics required for a specified exposure process to be performed by one or more photolithography tools, which may be represented by the tool 178. It should be appreciated that any other pre-exposure tools, such as resist coating tools, pre-exposure bake tools and the like, may be provided. For convenience, any such process tools are not shown. Furthermore, the plurality of process tools 171, 172, 173, 174 may be provided in the form of post-exposure process tools, such as post-exposure bake (PEB) plates, which may be considered as equivalent process tools. In this respect, an equivalent process tool may be considered as a process tool or a process chamber of a cluster tool which operate on the basis of substantially the same process recipe, at least for the plurality of substrates 175, in order to obtain substantially the same process output. For example, a plurality of individual process tools or a plurality of individual process chambers, which may not necessarily have the same hardware configuration, may be considered as equivalent as long as the tool setting is adjusted on the basis of the same process outcome. For instance, for an etch tool, irrespective of its hardware configuration, the process outcome may be a specified etch depth within a specified material layer, while, in a CVD tool, the process outcome may represent a specified material layer having a desired thickness, while, for instance, for the PEB plates 171, 172, 173, 174, the process outcome may be a specified temperature with a desired uniformity across each of the substrates 175. Since differences in configuration may exist, the parameter settings, i.e., the set points of tool parameters, may not be the same for obtaining the same desired process output. Nevertheless, these tools may be regarded as equivalent.

It should be appreciated that other post-exposure process tools may be provided, such as developer tools and the like, which may generate resist features that may be used for patterning, for instance, gate electrode structures and the like on the plurality of substrates 175.

The manufacturing environment 170 further comprises a metrology tool 177, which may also be comprised of a plurality of equivalent tools, depending on the measurement process to be performed. For example, the metrology tool 177 may represent an optical layer thickness measurement tool, which may determine a thickness of the exposed resist layer, as may be provided by the PEB tools 171, 172, 173, 174. In other cases, the metrology tool 177 may represent an inspection instrument that is configured to estimate a critical dimension of resist features obtained after the development of the exposed resist layer. The metrology tool 177 may be configured to provide measurement data on the basis of the dynamic or static sampling rate, with which a specific number of measurements is performed on one or more of the substrates 175 having passed through the process tools 176, 178 and 171, 172, 173, 174. For example, a sampling rate of three substrates from the plurality or lot of substrates 175 may be selected so that, for example, the PEB tools 171, 172 and 173 may provide a substrate to be subjected to measurement in the metrology tool 177, thereby producing new measurement data representing the process outcome with respect to the equivalent PEB tools 171, 172 and 173. During the processing of a next lot of substrates 175, sample substrates may be selected from the PEB tools 172, 173 and 174. As a consequence, for a subsequent state estimation on the basis of the recent results of the tools 172, 173 and 174, the corresponding measurement data related to the PEB tool 171 may be considered as delayed or aged measurement data, while, in the previous case, a state estimation based on the results of the tools 171, 172 and 173 may be based on delayed or aged measurement data associated with the PEB tool 174.

The control system 100 may comprise an input section 140, which is configured to receive measurement data from the metrology tool 177 or from any other instance, such as a supervising manufacturing execution system, as is typically provided in semiconductor facilities. The input section 140 may further be configured to receive a process state from a model section 120, which in turn is configured to estimate an updated process state of one or more of the process tools 171, 172, 173, 174, 176, 178 which is to be controlled by the system 100. For example, the model section 120 may comprise an algorithm for predicting a process output of the plurality of process tools 171, 172, 173, 174, 176, 178, for instance a layer thickness of an exposed resist layer, a critical dimension of a resist feature and the like, so as to provide a prediction for the actual process output, of which the measurement data supplied by the metrology tool 177 represent a more-or-less delayed or aged version from a previously performed process run. For example, the model section 120 may have implemented therein a model that is linearly dependent on one or more manipulated variables used for controlling the tool 178, since the exposure dose, for instance, exhibits a highly linear behavior with respect to the critical dimension under consideration.

The control system 100 further comprises a controller section 110, which is configured to determine one or more updated manipulated variables, such as exposure dose, exposure time and the like when the process tool to be controlled is a photolithography tool. For this purpose, the controller section 110 may comprise a specified control law, which may be considered as an algorithm for calculating updated manipulated variables on the basis of a target value for the process output, i.e., the control variable, and a difference of the predicted process output and the measurement data obtained. To this end, the controller section 110 may be connected to a module 150, which receives or has stored therein the target value of the process output and which also receives the difference of the predicted process output and the actual measurement values. The difference or error estimation may be supplied by a filter section 130 that is configured to operate on the predicted process output provided by the model section 120 and the measurement data provided by the metrology tool 177, wherein the corresponding data are provided by the input section 140. In one illustrative embodiment, the filter section 130 may have implemented therein an exponentially weighted moving average (EWMA) filter, which in principle provides an updated error estimate, i.e., a discrepancy between the predicted process output and the observed process output, on the basis of a history of the preceding error estimates, which are weighted on the basis of a scaling factor, which is usually referred to as λ. Hence, the EWMA filter 130 may provide an error estimation or bias to be used in the module 150.

The control system 100 further comprises a bias matrix manipulation section 160, which is configured to receive the bias values from the filter section 130 and also to receive metrology data from the tool 177. Moreover, the manipulation section 160 is further configured to provide a weighted mean bias on the basis of corresponding weighted relative biases that are associated with the plurality of equivalent process tools 171, 172, 173, 174.

During run time, the substrates 175 may be processed by the process tools 176, 178 and the equivalent tools 171, 172, 173, 174 and some of the substrate 175 may be supplied to the metrology tool 177 so as to obtain a specified set of measurement results. As previously discussed, it may be assumed that the tools 171, 172 and 173 may each provide a sample substrate for this run. Their respective measurement data may then be applied to the input section 140, in which a corresponding difference between the respective process outputs and the actual measurement data are determined, wherein the presently obtained measurement data may represent the tools 171, 172 and 173, while the tool 174 may still be assessed on the basis of a previously obtained measurement data. As previously explained, due to the sampling rate limitations, it is highly advantageous to track systematic deviations, i.e., biases with respect to a specified measurement event and the specific tool configuration, for instance including the four equivalent PEB tools, 171, 172, 173, 174, as relative values, wherein a corresponding relative bias may be defined for each possible combination of equivalent tools. In the above-illustrated example of four equivalent process tools 171, 172, 173, 174, six different relative biases may be defined, that is, 1-2, 1-3, 1-4, 2-3, 2-4 and 3-4, where "1", "2", "3", "4" correspond to the tools 171, 172, 173, 174, respectively, as indicated in the drawing. Hence, for the above selected sampling rate, measurement data may be obtained so as to define three relative biases corresponding to the differences 2-3, 1-2 and 1-3, while in a subsequent process run the corresponding relative biases corresponding to 2-3, 2-4, 3-4 may be determined. Consequently, only a few of all possible combinations of relative biases may be updated by measurement data obtained per measurement event. The respective bias $b_{ij}$ for any combination of tools may be determined by the EWMA filter 130 and may be provided to the manipulation section 160, in which the plurality of presently valid relative biases $b_{ij}$ may be represented in the form of a matrix, as is shown in Equation 1 for an illustrative example for the four equivalent process tools 171, 172, 173, 174:

$$(b_{ij}) = \begin{pmatrix} 0 & b_{12} & b_{13} & b_{14} \\ -b_{12} & 0 & b_{23} & b_{24} \\ -b_{13} & -b_{23} & 0 & b_{34} \\ -b_{14} & -b_{24} & -b_{34} & 0 \end{pmatrix} \quad (1)$$

where $b_{12}$ is the difference in bias between the tools 171, i.e., tool 1, and 172, i.e., the tool 2.

Hereby, the relative biases, i.e., the components of the bias matrix $B_{LP}$, are calculated by the filter section 130, for instance, on the basis of Equation 2:

$$[b_{ij}]_N = \lambda_N [\tilde{b}_{ij}]_N + (1-\lambda_N)[b_{ij}]_N \qquad (2)$$

where $\tilde{b}_{ij}$ represents actual measurement values and wherein Equation 2 may provide for the possibility of using a different filter parameter $\lambda_N$ for one or more of the metrology events N. As may be seen from Equation 2, the currently used bias $b_{ij}$ includes the controller history as well as the measurement data provided so far, wherein the value of $\lambda_N$ that is to be selected in the range of [0,1] significantly determines the controller behavior as the value of $\lambda_N$ determines the "strength" with which the process history influences the currently generated process state.

Consequently, depending on the number of equivalent process tools and the sampling rate, the components of the bias matrix have a varying age so that a determination of any mean bias based on the various relative biases of varying age and also of varying uncertainty will result in a less precise difference in the section 150 and thus in a less precise prediction of one or more manipulated variables used for controlling, for instance, the process tool 178. In principle, for a given bias, the corresponding value may be directly obtained from the bias matrix or the corresponding value may be calculated from a linear combination of other available relative biases. By way of example, the relative bias $b_{14}$ may be considered for the further explanation. In this case, the component $b_{14}$ may be obtained from the bias matrix (see Equation 1), or a linear combination of $b_{24}$-$b_{21}$, or $b_{34}$-$b_{31}$ may be used for determining the value of $b_{14}$. Ideally, these values would be exactly the same. However, due to the time delay in updating the various relative biases and using real data, i.e., including noise and thus having an uncertainty, the values are typically different. Moreover, the corresponding process tools 171, 172, 173, 174 may drift over time and, therefore, a significant deviation of the various relative biases, which should ideally result in the same value, may be observed. Consequently, in one illustrative embodiment, a weighted mean value of some, or in one particular embodiment of all, linear combinations which yield a $b_{14}$-equivalent bias, i.e., in this specific case: $b_{14}$, ($b_{24}$-$b_{21}$) and ($b_{34}$-$b_{31}$) may be used. In one illustrative embodiment, a weighting factor may be used on the basis of an age of the corresponding relative bias values. In one particular embodiment, a weighting factor is established on the basis of an age-based uncertainty of the respective relative biases.

In still other illustrative embodiments, the weighting factor may be based on a measure of the uncertainty of measurement data associated with the corresponding relative biases involved in determining the $b_{14}$-equivalent bias. For example, a measure for an uncertainty of a measurement data may be calculated on the basis of a standard error "s" according to Equation 3:

$$s = \frac{\sigma}{\sqrt{k}} \qquad (3)$$

wherein the standard error "s" is determined by the standard deviation $\sigma$ and the number of measurements k. It should be appreciated, however, that other statistical formulas and techniques may be used in calculating an uncertainty of measurement data. As previously explained with reference to Equation 2, since each bias value in the bias matrix is an EWMA of all observations of that particular bias, a corresponding uncertainty may be calculated by using the way in which the EWMA is calculated. Thus, an uncertainty of the corresponding relative biases, i.e., the EWMA estimates, may be obtained according to the following Equation 4, wherein for convenience the uncertainty "u" for the relative bias $b_{14}$ is illustrated:

$$u(b_{14}) = \sqrt{u^2[(b_{14})_N]\left[\prod_{i=0}^{N-1}(1-\lambda_i)\right]^2 + \ldots + u^2[(b_{14})_1][(1-\lambda_0)]^2 + u^2[(b_{14})_0]\lambda_0^2} \qquad (4)$$

Here, different filter factors $\lambda_i$ may be used for one or more metrology events N. As may be seen from Equations 4 and 3, an increased value for the uncertainty "u" may be obtained when the corresponding standard error for the respective metrology event N is increased, wherein the respective filter factor $\lambda$ is also taken into consideration. Consequently, for measurement data of increased noise or any other influences, which may lead to an increased uncertainty, this situation may be explicitly taken into consideration by weighting the respective relative biases prior to estimating an updated process state by means of the controller section 110.

In a further illustrative embodiment, alternatively or additionally to determining an uncertainty for each of the relative biases of the bias matrix, an age-based weighting factor may be established such that older measurement data may have a reduced influence on the calculation of a mean bias that may be used for the further calculation in determining manipulated variables to be used in the current control move. In one particular embodiment, an age-based component is combined with the uncertainty, for instance as determined above, such that older measurement data results in an increased uncertainty. This is particularly useful if a drift is observed in one or more of the equivalent process tools 171, 172, 173, 174. In one illustrative embodiment, an age-based weighting factor may be used to scale the uncertainty of the respective relative bias, wherein the corresponding age-based weighting factor may represent any appropriate function that increases the uncertainty with an increased age of the respective metrology event. For example, Equation 5 enables the determination of an age-based uncertainty u' on the basis of a scaling factor and the age of measurement data received from the metrology tool 177:

$$u'[(b_{14})_N] = u[(b_{14})_N]\exp(Kt_N) \qquad (5)$$

where u' $[(b_{14})_N]$ is the age-based uncertainty of the Nth observation of the relative bias $b_{14}$, $[(b_{14})_N]$ is the uncertainty of the Nth observation of the relative bias $b_{14}$, K is a scaling factor, for instance a constant factor that may be selected for a proper amount of increase in uncertainty with age, for example, a value of K=0.1 may result in a weighting of about 90% for 24-day-old data and 5% for 30-day-old data, and $t_N$ is the age of the measurement data corresponding to the Nth observation in hours.

In one illustrative embodiment, the weighting of the individual components of the bias matrix may be performed with the uncertainty and/or the age-based weighting factor, wherein, in one embodiment, a weighted mean value for each of the matrix components $b_{ij}$ may be calculated on the basis of some or all $b_{ij}$ equivalent relative biases and an age-based uncertainty, such as the uncertainty determined by Equation 5. In the case of the relative bias $b_{14}$, a corresponding weighted mean value $\hat{b}_{14}$ may be obtained according to Equation 6:

$$\hat{b}_{14} = \left( \frac{1}{u'(b_{14})} b_{14} + \frac{1}{u'(b_{24} - b_{21})}(b_{24} - b_{21}) + \frac{1}{u'(b_{34} - b_{31})} u'(b_{34} - b_{31}) \right) / \left( \frac{1}{u'(b_{14})} + \frac{1}{u'(b_{24} - b_{21})} + \frac{1}{u'(b_{34} - b_{31})} \right)$$

where $$u'(b_{24} - b_{21}) = \sqrt{u'(b_{24}) + u'(b_{21})} \quad (7)$$
$$u'(b_{34} - b_{31}) = \sqrt{u'(b_{34}) + u'(b_{31})}$$

Consequently, using the weighted mean value $\hat{b}_{ij}$ as estimates for the respective components of the bias matrix may significantly enhance the control efficiency, since data with small uncertainty, i.e., the number of sample substrates is higher while the historical variance is lower, and/or with the lowest age, i.e., the most recent measurement data, is weighed more heavily. Thus, a weighted matrix may be defined by determining the respective weighted mean values for each of the components of the original bias matrix. Equation 8 illustrates the weighted bias matrix, now including the weighted mean values for each of the relative biases $b_{ij}$:

$$(\hat{b}_{ij}) = \begin{pmatrix} 0 & \hat{b}_{12} & \hat{b}_{13} & \hat{b}_{14} \\ & 0 & \hat{b}_{23} & \hat{b}_{24} \\ & & 0 & \hat{b}_{34} \\ & & & 0 \end{pmatrix} \quad (8)$$

On the basis of the weighted bias matrix of Equation 8, a representative mean bias for each of the equivalent process tools 171, 172, 173, 174 may be calculated by using the respective averaged relative biases associated with a respective one of the tools 171, 172, 173, 174. That is, a mean bias for the tool 171 may be calculated by using the components of the weighted bias matrix of the first row, using, for instance, a simple averaging algorithm such as illustrated in Equation 9:

$$\bar{b}_1 = \frac{0 + \hat{b}_{12} + \hat{b}_{13} + \hat{b}_{14}}{4} \quad (9)$$

A corresponding mean bias may thus be established for each of the equivalent tools 171, 172, 173, 174.

In a next step, so-called delta-to-mean values may then be determined for each of the equivalent process tools by using the respective mean values established for each of the process tools 171, 172, 173, 174. For instance, the corresponding delta-to-mean values may be calculated by subtracting the respective mean bias from the corresponding respective relative mean bias. For instance, a corresponding matrix of delta-to-mean values $(\tilde{b}_{ij})$ may be obtained according to Equation 10:

$$(\tilde{b}_{ij}) = \begin{pmatrix} 0 - \bar{b}_1 & \hat{b}_{12} - \bar{b}_1 & \hat{b}_{13} - \bar{b}_1 & \hat{b}_{14} - \bar{b}_1 \\ -\hat{b}_{12} - \bar{b}_2 & 0 - \bar{b}_2 & \hat{b}_{23} - \bar{b}_2 & \hat{b}_{24} - \bar{b}_2 \\ & & 0 - \bar{b}_3 & -\hat{b}_{34} - \bar{b}_3 \\ & & & 0 - \bar{b}_4 \end{pmatrix} \quad (10)$$

Then, based on the matrix according to Equation 10, a corresponding "consensus" delta-to-mean value may be determined for each of the equivalent process tools 171, 172, 173, 174 by determining a weighted mean value of each row of the matrix according to Equation 10. A corresponding weighting factor may be obtained, as in the case described above, by the reciprocal of the respective uncertainty (see Equation 6). Based on the corresponding consensus delta-to-mean values, individual substrate offsets may be calculated with respect to the equivalent process tools 171, 174, thereby enabling the controller section 110 to provide manipulated variables to one or more of the process tools 178, 176, 171, 172, 173, 174 for efficient process control.

With reference to FIGS. 2a and 2b, the process flow in accordance with illustrative embodiments of the present invention is illustrated as a flowchart for describing the actions performed during operation of the control system 100 according to the processing of the substrate 175 in the manufacturing environment 170.

In FIG. 2a, the process flow 200 comprises, according to box 210, the selecting of measurement data according to a specified sampling rate by means of the metrology tool 177, wherein, in some embodiments, the sampling rate may result in a delay of the measurement data. For instance, in a process flow in which each process run of the environment 170 is based on the processing of a plurality of substrates, the sampling rate may be selected so as to not provide measurement data for each of a plurality of control threads due to throughput and metrology tool capability limitations. In box 220, weighted components of a bias matrix may be determined, wherein the bias matrix includes the respective relative biases of a plurality of control threads represented by a plurality of equivalent process tools. Hereby, appropriate weighting factors may be determined, for instance on the basis of measurement data related aspects, such as uncertainty of measurement data, delay of measurement data and the like. Based on correspondingly weighted components of the bias matrix, in box 230, the manipulated variables are determined on the basis of a control law and the weighted bias matrix so as to control a subsequent process run.

FIG. 2b illustrates activities corresponding to box 220 in more detail in accordance with illustrative embodiments of the present invention. Thus, in step 221, an uncertainty and/or an age of measurement data related to each of the components of the bias matrix is determined. Next, in step 222, a weighted mean value for each matrix component is calculated, wherein the weighting factor may include the uncertainty and/or the age of measurement data determined in step 221. Thereafter, in step 223, a mean bias is calculated for each control thread, i.e., for each equivalent process tool used in the manufacturing process under consideration, and, in step 224, a corresponding deviation from the mean bias, that is a delta-to-mean value, is calculated for each component of the relative bias matrix. Then, in step 225, a consensus mean bias for each control thread may be calculated, wherein, in some embodiments, the weighting factor or factors may be used, as are already employed for the calculation of a weighted mean value in step 222.

As a result, the present invention provides a technique in which the bias of a plurality of process tools may be effectively monitored on the basis of a bias matrix including the relative biases, wherein an APC control is based on the weighted bias value in which an age and/or an uncertainty of measurement data is explicitly taken into consideration. Consequently, appropriate state estimation results may be obtained on the basis of the relative bias matrix components, while effectively compensating for controller inefficiencies due to the difference in age and uncertainty of measurement data, which may be caused by sampling rate limitations. Thus, the overall efficiency of an APC controller may be significantly enhanced.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   performing a specified manufacturing process on a group of substrates in a plurality of equivalent process tools;
   obtaining measurement data of a process output from some of said group of substrates processed by said plurality of equivalent process tools;
   determining updated values of relative biases for each of said plurality of equivalent process tools by comparing said measurement data and based on a current value of said relative biases, said relative biases quantifying a deviation of said process output of said manufacturing process between a respective two of said plurality of equivalent process tools;
   weighting said relative biases an age of said measurement data; and
   controlling said manufacturing process said weighted relative biases.

2. The method of claim 1, further comprising determining an uncertainty of each of said relative biases and weighting said relative biases said uncertainties.

3. The method of claim 2, wherein determining said updated values of said relative biases comprises using an exponentially weighted moving average (EWMA).

4. The method of claim 1, further comprising determining each relative bias a plurality of equivalent relative biases.

5. The method of claim 4, wherein determining each relative bias on the basis of a plurality of equivalent relative biases comprises determining a weighted sum of said equivalent relative biases.

6. The method of claim 5, further comprising determining a mean bias for each of said plurality of equivalent process tools relative biases related to a respected one of said plurality of equivalent process tools and determined by said weighted sum of said equivalent relative biases.

7. The method of claim 6, further comprising determining a deviation for each relative bias said mean biases and said weighted sum of equivalent relative biases.

8. The method of claim 7, further comprising determining a consensus mean bias for each of said plurality of equivalent process tools by using a weighted sum of said deviation associated with a respective one of said plurality of equivalent process tools.

9. The method of claim 8, wherein controlling said manufacturing process is performed said consensus mean biases.

10. The method of claim 1, wherein weighting said relative biases on the basis of the age of said measurement data comprises using an exponential dependency.

11. The method of claim 1, wherein a number of said some substrates used for obtaining said measurement data is less than a number of said plurality of equivalent process tools.

12. The method of claim 1, wherein said plurality of equivalent process tools comprises one of post-exposure bake tools and chemical vapor deposition tools.

13. The method of claim 1, wherein controlling said manufacturing process comprises controlling at least a lithography tool.

14. A method, comprising:
    controlling a manufacturing process relative biases, each relative bias associated with a respective one of a plurality of equivalent process tools used in said manufacturing process and being generated by quantifying deviations in measurement data of a process output of the manufacturing process between two respective equivalent process tools; and
    determining said relative biases a weighting factor indicating an uncertainty of measurement data associated with a respective one of said relative biases.

15. The method of claim 14, further comprising weighting said relative biases an age of measurement data associated with said relative biases.

16. The method of claim 14, further comprising determining each relative bias a plurality of equivalent relative biases.

17. The method of claim 16, wherein determining each relative bias on the basis of a plurality of equivalent relative biases comprises determining a weighted sum of said equivalent relative biases.

18. The method of claim 17, further comprising determining a mean bias for each of said plurality of equivalent process tools relative biases related to a respected one of said plurality of equivalent process tools and determined by said weighted sum of said equivalent relative biases.

19. The method of claim 18, further comprising determining a deviation for each relative bias said mean biases and said weighted sum of equivalent relative biases.

20. The method of claim 19, further comprising determining a consensus mean bias for each of said plurality of equivalent process tools by using a weighted sum of said deviation associated with a respective one of said plurality of equivalent process tools.

21. A control system, comprising:
    a model-based controller implemented by a processing device and configured to determine at least one updated manipulated variable for a process tool of a process sequence a model, measurement data of a process output associated with said process tool, a relative bias matrix including a plurality of relative biases, each quantifying a deviation of said process output between respective pairs of a plurality of equivalent process tools including said process tool, and a weighting factor for operating on said relative bias matrix, said weighting factor indicating at least one of an age of said measurement data and an uncertainty thereof.

* * * * *

UNITED STATES PATENT AND TRADEMARK OFFICE
CERTIFICATE OF CORRECTION

| | | |
|---|---|---|
| PATENT NO. | : 7,869,894 B2 | Page 1 of 1 |
| APPLICATION NO. | : 11/420625 | |
| DATED | : January 11, 2011 | |
| INVENTOR(S) | : James Broc Stirton and Andre Holfeld | |

It is certified that error appears in the above-identified patent and that said Letters Patent is hereby corrected as shown below:

Col. 13, line 40 (claim 1, line 14), after "relative biases" insert -- on the basis of --.

Col. 13, line 42 (claim 1, line 16), after "process" insert -- on the basis of --.

Col. 13, line 46 (claim 2, line 3), after "relative biases" insert -- on the basis of --.

Col. 13, line 51 (claim 4, line 2), after "relative bias" insert -- on the basis of --.

Col. 13, line 58 (claim 6, line 3), after "tools" insert -- on the basis of --.

Col. 13, line 62 (claim 7, line 2), after "relative bias" insert -- on the basis of --.

Col. 14, line 5 (claim 9, line 2), after "performed" insert -- on the basis of --.

Col. 14, line 19 (claim 14, line 2), after "process" insert -- on the basis of --.

Col. 14, line 26 (claim 14, line 9), after "relative biases" insert -- on the basis of --.

Col. 14, line 30 (claim 15, line 2), after "relative biases" insert -- on the basis of --.

Col. 14, line 33 (claim 16, line 2), after "relative bias" insert -- on the basis of --.

Col. 14, line 40 (claim 18, line 3), after "tools" insert -- on the basis of --.

Col. 14, line 44 (claim 19, line 2), after "relative bias" insert -- on the basis of --.

Col. 14, line 55 (claim 21, line 5), after "sequence" insert -- on the basis of --.

Signed and Sealed this
Fifteenth Day of March, 2011

David J. Kappos
*Director of the United States Patent and Trademark Office*